United States Patent
Bhalla et al.

(10) Patent No.: US 8,431,989 B2
(45) Date of Patent: Apr. 30, 2013

(54) SHIELDED GATE TRENCH (SGT) MOSFET DEVICES AND MANUFACTURING PROCESSES

(75) Inventors: Anup Bhalla, Santa Clara, CA (US); Sik K. Lui, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/066,947

(22) Filed: Apr. 28, 2011

(65) Prior Publication Data
US 2011/0204440 A1 Aug. 25, 2011

Related U.S. Application Data

(62) Division of application No. 12/653,355, filed on Dec. 11, 2009, now Pat. No. 7,936,011, and a division of application No. 11/356,944, filed on Feb. 17, 2006, now Pat. No. 7,633,119.

(51) Int. Cl.
*H01L 29/66* (2006.01)

(52) U.S. Cl.
USPC ........... 257/330; 257/331; 257/332; 257/333; 257/E29.201; 257/E29.26

(58) Field of Classification Search .......... 257/330–334, 257/E29.201, E29.26
See application file for complete search history.

(56) References Cited

U.S. PATENT DOCUMENTS
2003/0178676 A1 * 9/2003 Henninger et al. ........... 257/340
* cited by examiner

*Primary Examiner* — Tan N Tran
(74) *Attorney, Agent, or Firm* — Bo-In Lin

(57) ABSTRACT

This invention discloses a semiconductor power device that includes a plurality of power transistor cells surrounded by a trench opened in a semiconductor substrate. At least one of the cells constituting an active cell has a source region disposed next to a trenched gate electrically connecting to a gate pad and surrounding the cell. The trenched gate further has a bottom-shielding electrode filled with a gate material disposed below and insulated from the trenched gate. At least one of the cells constituting a source-contacting cell surrounded by the trench with a portion functioning as a source connecting trench is filled with the gate material for electrically connecting between the bottom-shielding electrode and a source metal disposed directly on top of the source connecting trench. The semiconductor power device further includes an insulation protective layer disposed on top of the semiconductor power device having a plurality of source openings on top of the source region and the source connecting trench provided for electrically connecting to the source metal and at least a gate opening provided for electrically connecting the gate pad to the trenched gate.

19 Claims, 10 Drawing Sheets

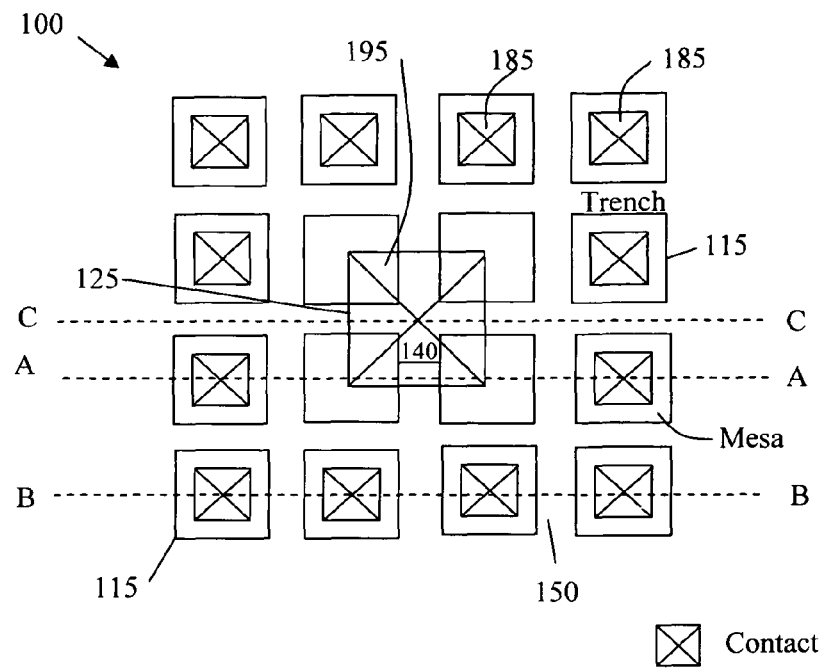
Fig. 2A
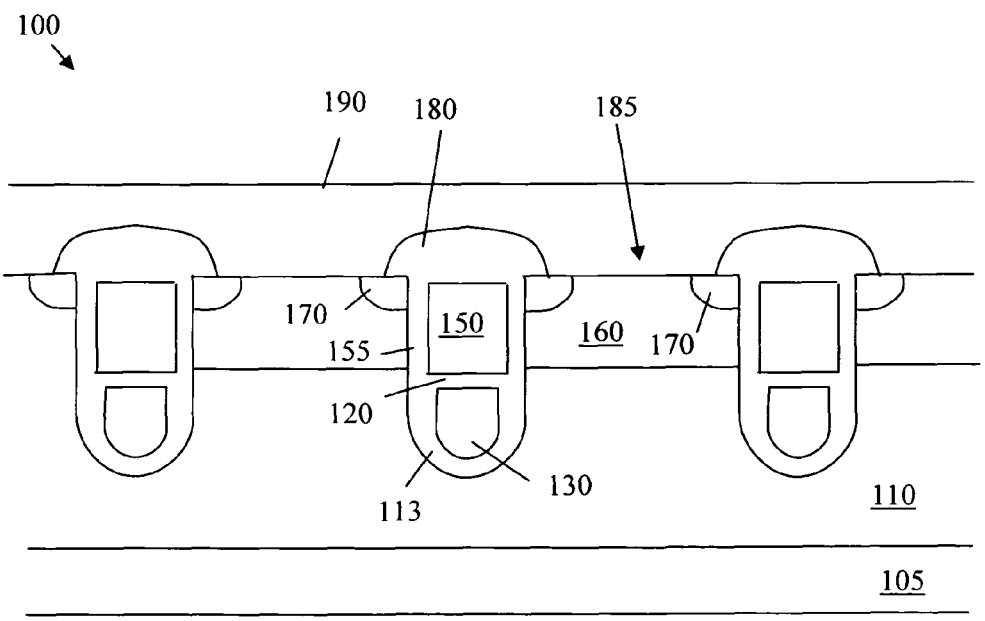
Fig. 2B  Section B-B

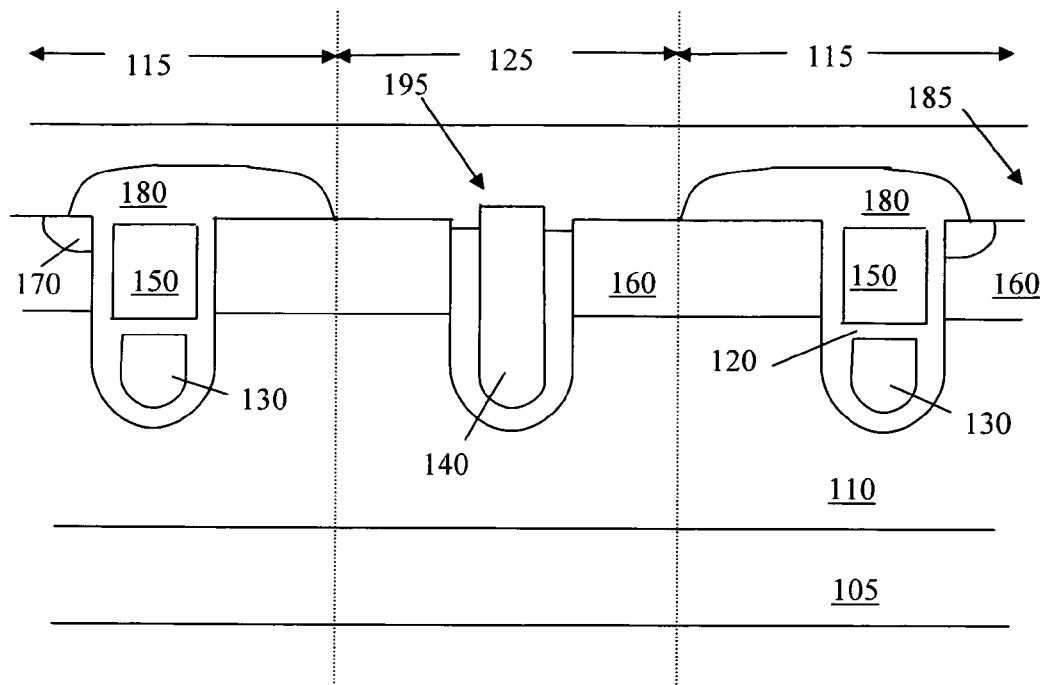
Fig. 2C Section A-A
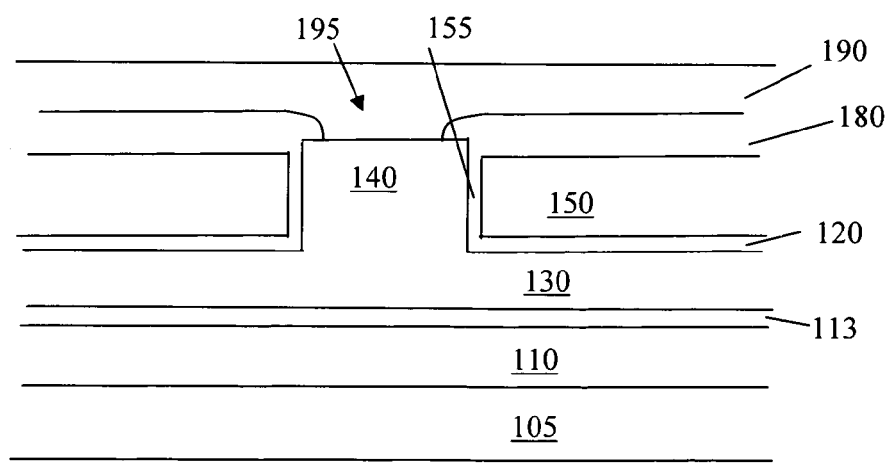
Fig. 2D Section

US 8,431,989 B2

SHIELDED GATE TRENCH (SGT) MOSFET DEVICES AND MANUFACTURING PROCESSES

This Patent Application is a Divisional Application and claims the Priority Date of a application Ser. No. 11/356,944 filed on Feb. 17, 2006 now issued into U.S. Pat. No. 7,633,119 and a application Ser. No. 12/653,355 filed on Dec. 11, 2009 now U.S. Pat. No. 7,936,011 by common Inventors of this Application. The Disclosures made in the patent application Ser. Nos. 11/356,944 and 12/653,355 are hereby incorporated by reference.

BACKGROUND OF THE INVENTION

1. Field of the Invention

The invention relates generally to the semiconductor power devices. More particularly, this invention relates to an improved and novel manufacturing process and device configuration for providing the MOSFET device with shielded trench gates (STG) for providing high frequency power switching device.

2. Description of the Prior Art

Conventional technologies for reducing the gate to drain capacitance Cgd in a power semiconductor device are still confronted with technical limitations and difficulties. As there are growing demands for high frequency switch power devices, an urgent need exists to provide effective solutions to achieve the purpose of resolving these technical difficulties and limitations. For power transistors including MOSFET and IGBT, a new device configuration and manufacturing process are necessary to reduce the speed-limiting capacitance between the gate and the drain of these switching power devices.

Baliga discloses in U.S. Pat. No. 5,998,833 a DMOS cell as shown in FIG. 1A. A source electrode is placed underneath the trenched gate to reduce the gate-to-drain capacitance. The gate of the DMOS cell is divided into two segments. The gate-to-drain capacitance is reduced because the contributions to capacitance from the gate-drain overlapping areas are eliminated.

In U.S. Pat. No. 6,690,062, a MOSFET device as shown in FIG. 1B is disclosed where the switching behavior of a transistor configuration is improved by providing a shielding electrode in an edge region. The shielding electrode surrounds at least sections of an active cell array. There is a capacitance between an edge gate structure and a drain zone. The shielding electrode located in the edge region reduces the capacitance between an edge gate structure and a drain zone hence reduces the gate-drain capacitance $C_{GD}$ of the transistor.

In U.S. Pat. No. 6,891,223, Krumrey et al. disclose a transistor that includes transistor cells disposed along trenches in a semiconductor substrate with two or more electrode structures disposed in the trenches. Furthermore, metallization structures are disposed above the substrate surface as shown in FIG. 1C. The trenches extend into an inactive edge region of the transistor. An electrical connection between the electrode structures and corresponding metallization are established in the edge regions.

The above patented-disclosures including transistor configurations still have a common difficulty. The source electrode disposed on the trench bottom is connected to the source voltage through an edge area of the semiconductor power device. This inevitably increases the source electrode resistance. Furthermore, the extra masks needed to create such connection also increase the cost of manufacturing.

Therefore, a need still exists in the art of power semiconductor device design and manufacture to provide new manufacturing method and device configuration in forming the power devices such that the above discussed problems and limitations can be resolved.

SUMMARY OF THE PRESENT INVENTION

It is therefore an aspect of the present invention to provide a new and improved semiconductor power device implemented with the shielded gate trench (SGT) structure that has the bottom-shielding electrode provided with improved connection more directly to the source voltage. Specifically, a macro-cell layout approach is disclosed. In the macro-cell, a trench filled with conductive material such as doped polysilicon is employed to electrically connect the bottom-shielding electrode of the SGT structure directly to the source metal. The above-discussed problems and difficulties of the convention configurations with source voltage connections via a peripheral portion of the device are therefore resolved.

Specifically, it is an aspect of the present invention to provide improved SGT device configuration and manufacturing method to reduce the gate to drain capacitance. A new method for manufacturing a semiconductor power device is disclosed. The method includes a step of opening a trench in a substrate for surrounding a plurality of power transistor cells and filling the trench with a gate material. The method further includes a step of applying a time etch for etching back the gate material from a selected portion of the trench followed by covering a bottom portion of the gate material in the selected portion of the trench with an insulation layer to form a bottom-shielding electrode while keeping the gate material in a remainder portion of the trench as a source connecting electrode to maintain direct electrical connection to the bottom-shielding electrode. This method of manufacturing semiconductor power device provides direct electrical connections of the SGT structure disposed underneath the trenched gate to the source metal via a plurality of trenched "source connecting electrodes" with these source connecting trenches filled with the gate material, e.g., the gate polysilicon, servicing as interconnection for the SGT to the source metal. This direct electrical connection is provided by a next step of forming an electrical connection from the gate material in the remainder portion of the trench to a source metal. Furthermore, the method includes a step of filling a selected portion of a trench with the gate material and forming an electrical connection for connecting the trenched gate to a gate pad. In the manufacturing processes, there is further step of controlling the time etch in removing the gate material from a top portion of the selected portion of the trench for controlling a depth of a trenched gate of the semiconductor power device. The method further includes a step of forming an insulation layer for covering a top surface of the semiconductor power device and opening a plurality of source contact openings on top of the remainder portion of the trench to form source contact to direct contact the gate material in the remainder portion of the trench for electrically connecting to the bottom-shielding electrode. Furthermore, the method further includes a step of forming an insulation layer for covering a top surface of the semiconductor power device and opening at least a gate contact opening for providing a gate pad to electrically connecting to the gate material in the trenched gate in the selected portion of the trench.

Briefly in a preferred embodiment this invention discloses a trenched semiconductor power device. The trenched semiconductor power device includes a plurality of interconnected trenches formed on a semiconductor substrate. At least one of the interconnected trenches constitutes a shielded gate trench (SGT) for the semiconductor power device. The SGT includes a trenched gate disposed on an upper portion of the SGT and a bottom-shielding electrode disposed on a bottom portion of the SGT insulated from the trenched gate. At least one of the interconnected trenches constitutes a source-connecting trench filled with a conductive trench-filling material electrically connected to the bottom-shielding electrode of the SGT for electrically connecting to a source metal disposed on top of the source-connecting trench These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 2A is a top view and 2B to 2D are three cross sectional views of a trenched MOSFET device implemented with improved configuration of this invention.

DETAILED DESCRIPTION OF THE METHOD

Figure 1A:
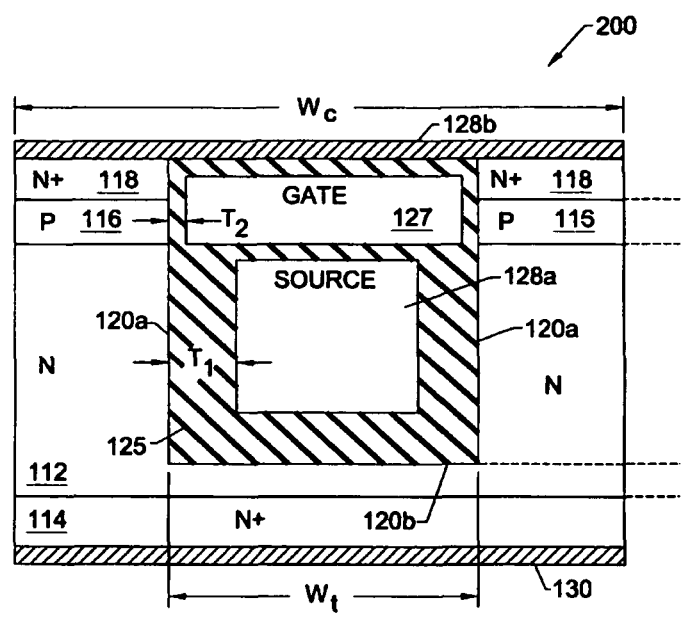
FIGS. 1A to 1C are cross sectional views of trenched MOSFET devices disclosed in patented disclosures for reducing gate-drain capacitance.
Figure 1B:
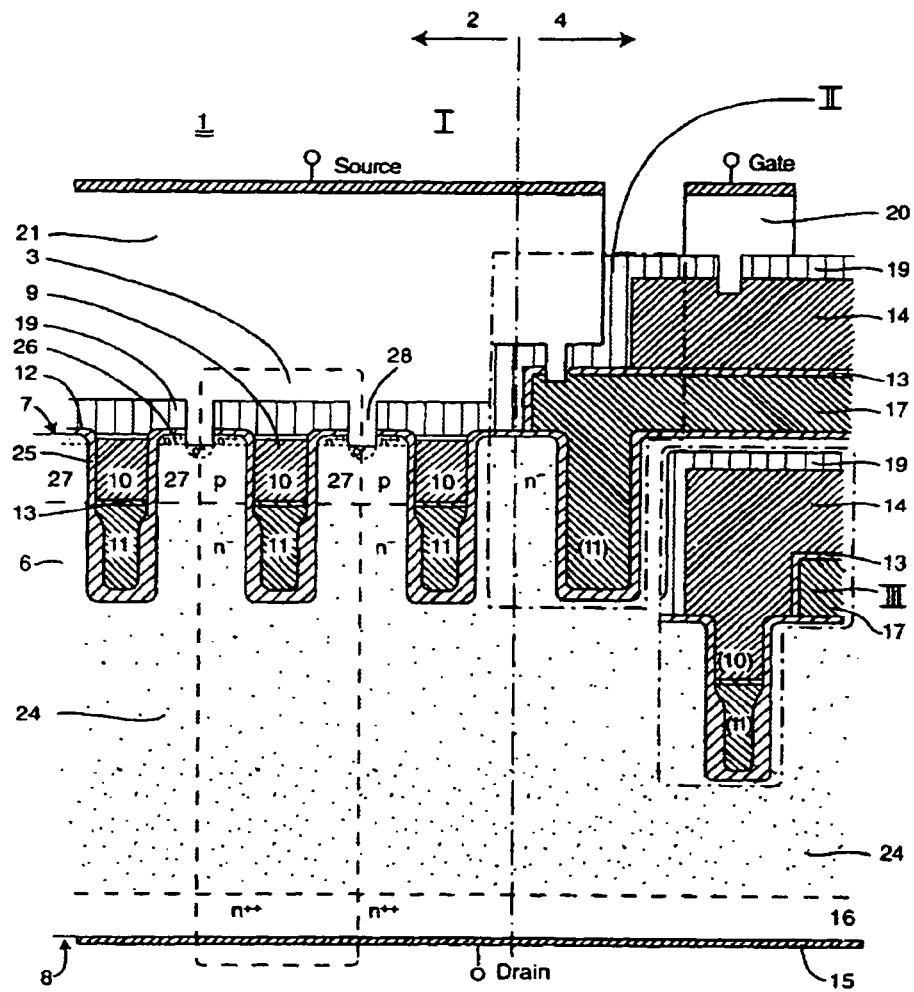
Figure 1C:
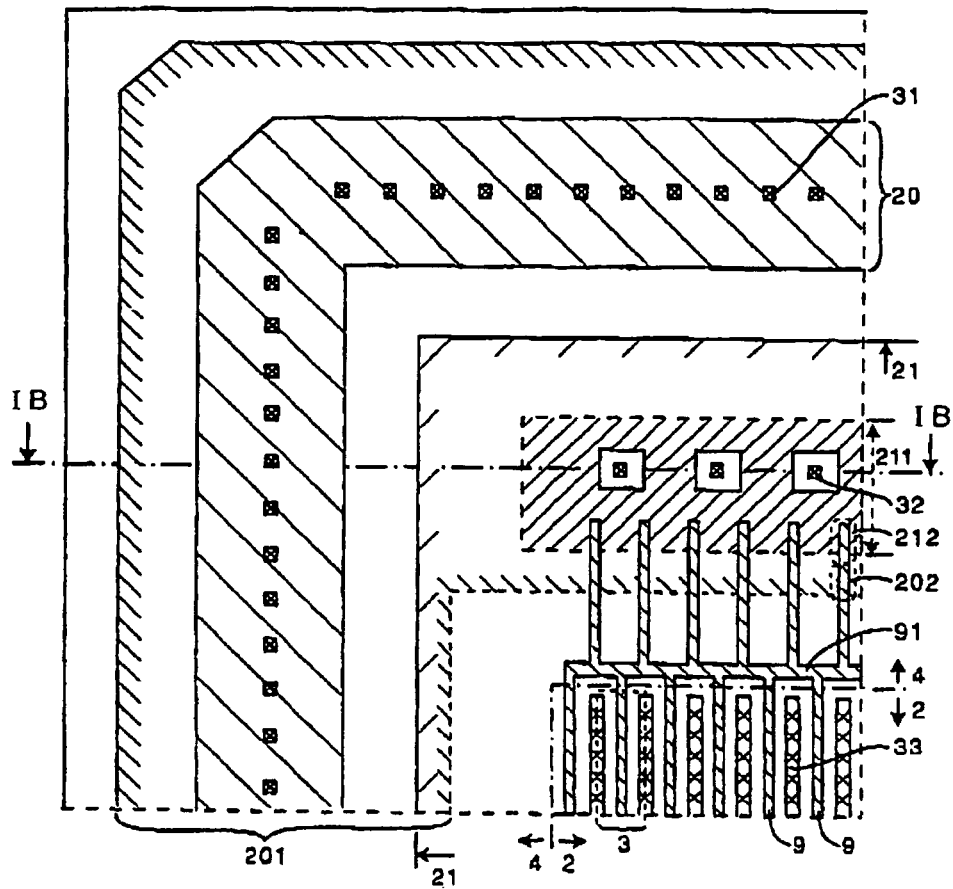

Referring to FIGS. 2A to 2D for a top view and three cross sectional views respectively of a trenched MOSFET device 100 of this invention. As shown in FIG. 2B, the trenched MOSFET device 100 is supported on a substrate 105 formed with an epitaxial layer 110. The trenched MOSFET device 100 includes a shielded gate trench (SGT) structure. The SGT structure includes a bottom-shielding electrode 130 insulated from and disposed below a trenched gate 150. The bottom SGT structure 130 filled with a polysilicon therein is provided to shield the trenched gate 150 from the drain disposed below trench bottom. The bottom SGT structure 130 is insulated from the drain region by a dielectric layer 113. An insulation layer 120 separated the bottom-shielding electrode 130 from the trenched gate 150. The trenched gate 150 includes polysilicon filling in a trench surrounded with a gate insulation layer 155 covering the trench walls. A body region 160 that is doped with a dopant of second conductivity type, e.g., P-type dopant, extends between the trenched gates 150. The P-body regions 160 encompassing a source region 170 doped with the dopant of first conductivity, e.g., N+ dopant. The source regions 170 are formed near the top surface of the epitaxial layer surrounding the trenched gates 150. On the top surface of the semiconductor substrate is also an insulation layer 180. The contact openings 185 and 195 are opened through the insulation layer 180 to contact the source metal layer 190. As shown in FIGS. 2C-2D, the bottom-shielding electrode 130 is electrically connected to the source metal 190 through the trenched source-connecting electrode 140. The trenched source-connecting electrode 140 is electrically connected to the bottom-shielding electrode 130 through the interconnected trenches that extend between the MOSFET cells. The trenched source connecting electrode 140 may be extrude beyond the top surface of body region 160 and source region 170 as shown in FIG. 2C to increase the area of contact.

FIG. 2A shows a macro cell layout of the device wherein each active cell has a square layout defined by surrounding trenches formed as trenched gates 150 with bottom-shielding electrode 130 functioning as the SGT structure. In region 195 where two trenches intersect, a trenched source connecting electrode is formed to electrically connect to bottom-shielding electrode 130. This region 195 may be extended beyond the intersection region so that the trenched source connecting electrode 140 would extend into a portion of the trenches. Alternatively it is also possible to form the source connecting electrode 140 in a region 195 where trenches do not intersect. In addition to squares as shown in FIG. 2A, other kind of polygons, such as triangle, rectangular and hexagonal may also be implemented. Each macro cell as shown in FIG. 2A includes a plurality of active cells 115 and at least a region 125. The active cells 115 is defined and surrounded by trenched gates 150 while inside the area 125, the trench 140 is filled with gate filling material to electrically connect the bottom-shielding electrode 130 to the source contact metal. FIG. 2C shows the boundary lines of the area 125 and the active cells 115. Furthermore, the bottom-shielding electrode 130 of the SGT structure is shown as connected to the trenched source-connecting electrode 140 through interconnecting trenches 130 (in the active cell area 115) and also trench 140 (in the source-contact trench area 125). Interconnections of these trenches are provided through a third dimension and via trenches behind and before the cross sectional surface as shown in FIG. 2D.

According FIGS. 2A to 2D and above descriptions, this invention discloses a trenched semiconductor power device. The trenched semiconductor power device includes a plurality of interconnected trenches form on a semiconductor substrate. At least one of the interconnected trenches constitutes a shielded gate trench (SGT) for the semiconductor power device. The SGT includes a trenched gate disposed on an upper portion of the SGT and a bottom-shielding electrode disposed on a bottom portion of the SGT insulated from the trenched gate. At least one portion of the interconnected trenches constitutes a source-connecting trench filled with a conductive trench-filling material electrically connected to the bottom-shielding electrode of the SGT for electrically connecting to a source metal disposed on top of the source-connecting trench.

Figure 3A:
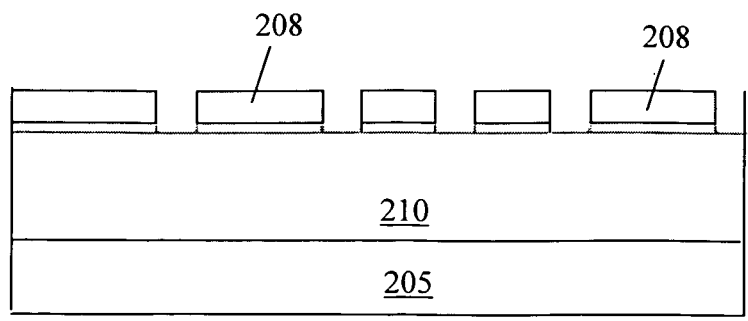
FIGS. 3A to 3L are a serial cross sectional views for describing a manufacturing process to provide a trenched MOSFET device as shown in FIG. 2.
Figure 3B:
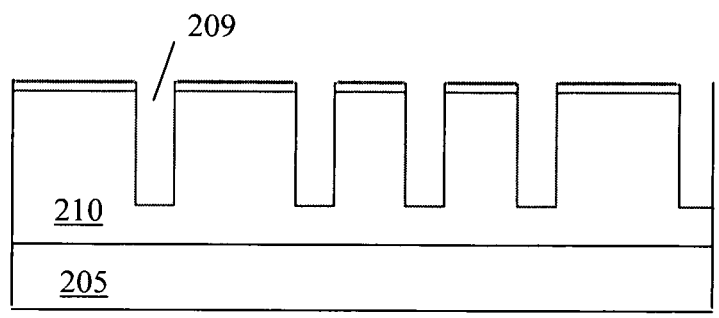
Figure 3C:
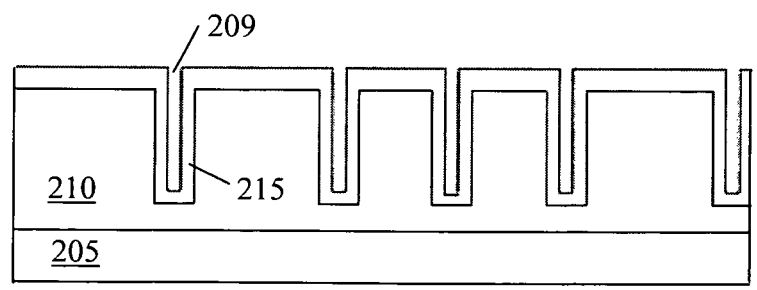

Referring to FIGS. 3A to 3L for a serial of side cross sectional views to illustrate the fabrication steps of a MOSFET device as that shown in FIGS. 2A to 2D. In FIG. 3A, a trench mask 208 is applied as first mask to create an oxide hard mask 206 and then removed. Referring to FIG. 3B, a trench etch process is carried out to open a plurality of trenches 209 in an epitaxial layer 210 supported on a substrate 205. The net depth as required for both electrodes and the targeted oxide thickness determines the trench depth. In FIG. 3C, a sacrificial oxidation is performed followed by an oxide etch to remove the damaged surface on the trench wall to smooth the sidewalls. Then a gate oxidation is performed to grow a gate oxide layer 215. A thick oxide layer 215 is grown to a thickness based on device optimization for low Rds and high breakdown voltage. A thicker oxide layer 215 here reduces the silicon surface electric field, allowing the use of higher doping and leading to lower Rds for the same breakdown rating.

Figure 3D:
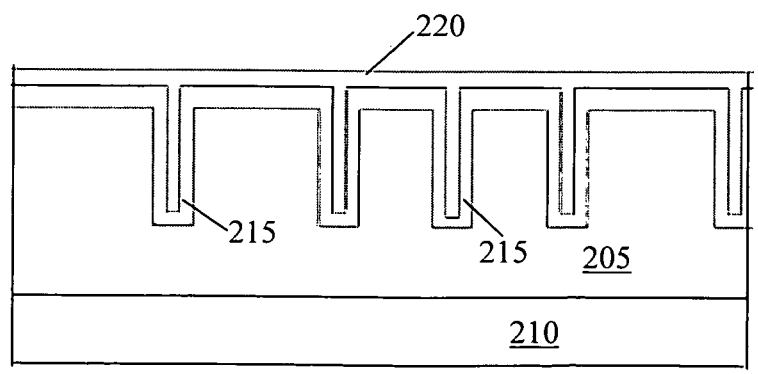
Figure 3E:
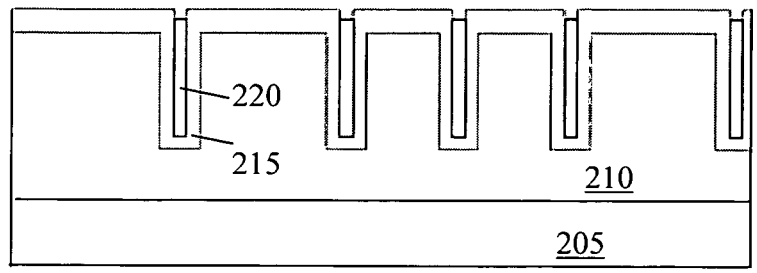
Figure 3F:
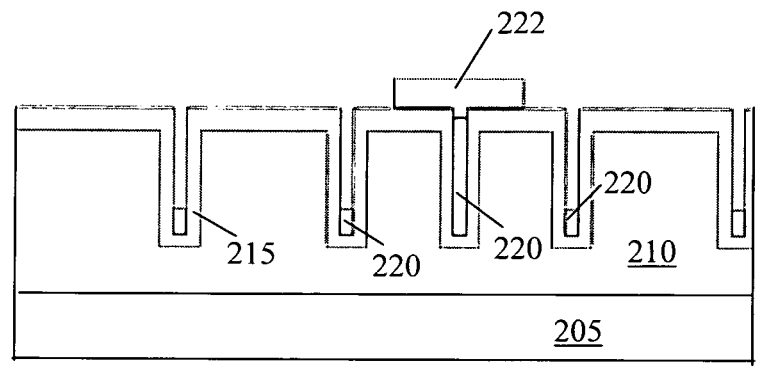
Figure 3G:
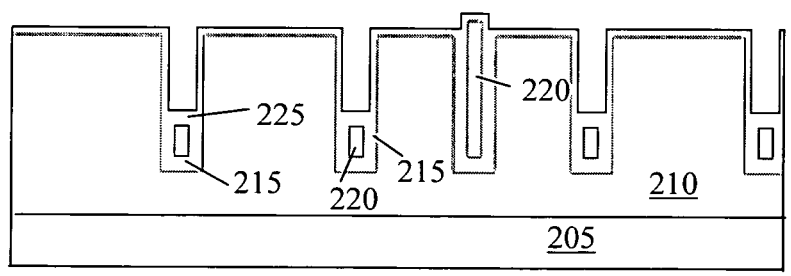
Figure 3H:
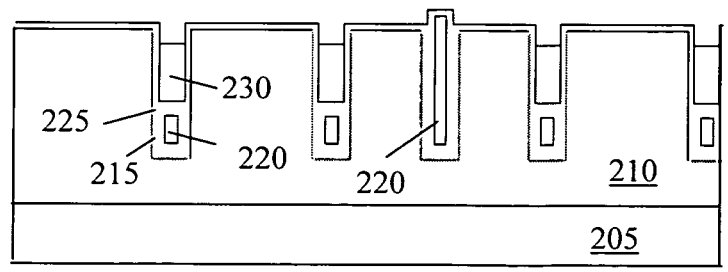

In FIG. 3D, a source polysilicon layer 220 is deposited into the trenches 209. In FIG. 3E, a blanket polysilicon etch back is performed to etch back the source polysilicon layer 220. The source polysilicon layer 220 is etched back without a mask until it is just below the top surface of the oxide. In FIG. 3F, a second mask, i.e., a source polysilicon mask 222, is applied to cover a portion of source polysilicon layer 220 inside designated source contact trenches. Then the source polysilicon layer 220 is etched back to remove the upper portion inside the trenches designated for trenched gate. The source polysilicon 220 is etched to a target depth using a timed etch-back process. The source polysilicon mask 222 is removed. The thick oxide is stripped using a wet etch, until the top surface and sidewalls are clear in the area not encapsulated by the source polysilicon. Care is taken to not excessively over etch this oxide within the lower portion of trench. In FIG. 3G, a thin gate oxide layer 225 is formed to cover the upper portion of trench wall and the top surface of the remaining source polysilicon layer 220 to form the bottom-shielding electrode. A thin oxide on the gate trench sidewall provides the advantage of reducing gate threshold voltage. The gate oxidation process grows a thicker oxide over all the exposed poly regions, due to the well known enhanced oxidation in doped polysilicon. This thicker oxide surrounding the bottom SGT structure has the advantage of improving the breakdown voltage. In FIG. 3H, a gate polysilicon layer 230 is deposited into the gate trenches and etched back to form the trenched gate. This gate polysilicon layer 230 is simply etched back using no mask, until it lies everywhere just below the surface of the top surface oxide.

Figure 3I:
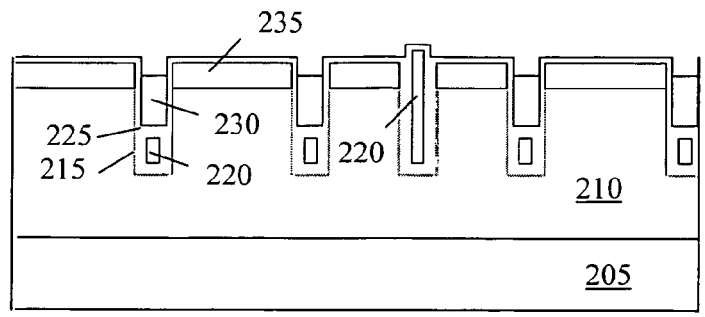
Figure 3J:
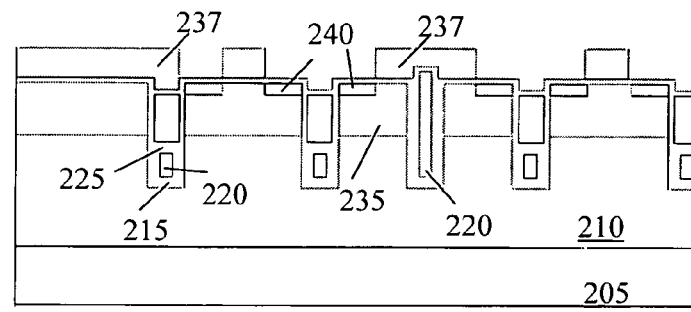
Figure 3K:
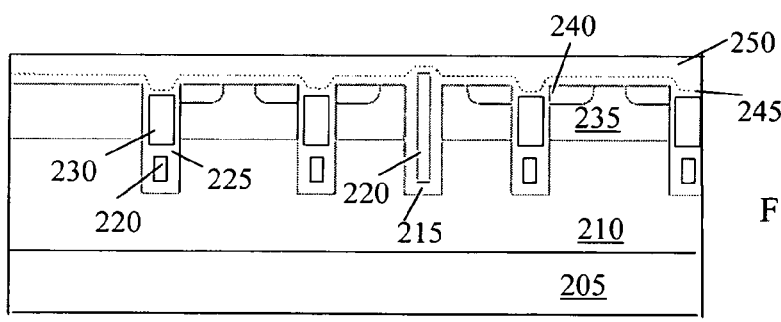

In FIG. 3I, a body dopant implant to form a plurality of body dopant regions 235 is carried out by employing a body mask (not shown). This body mask excludes the body region from specific locations in the termination area leading to the formation of guard ring type termination structures. The termination area structure will allow the device to block high voltages. In FIG. 3J, the body mask is removed followed by a body diffusion to form the body regions 235. The body drive diffuses the dopant to the desired depth that is no deeper than the upper gate electrode. Then a fourth mask, i.e., the photoresist as source mask 237, is applied to carry out a source dopant implant to form a plurality of source dopant regions 240. A local oxide thinning is performed before the source is implanted. In FIG. 3K, the photoresist layer 237 is removed, followed by applying an elevated temperature to diffuse the source regions 240. After a source drive, the LTO layer 245 and BPSG layer 250 are deposited. Then, a BPSG flow process is performed.

Figure 3L:
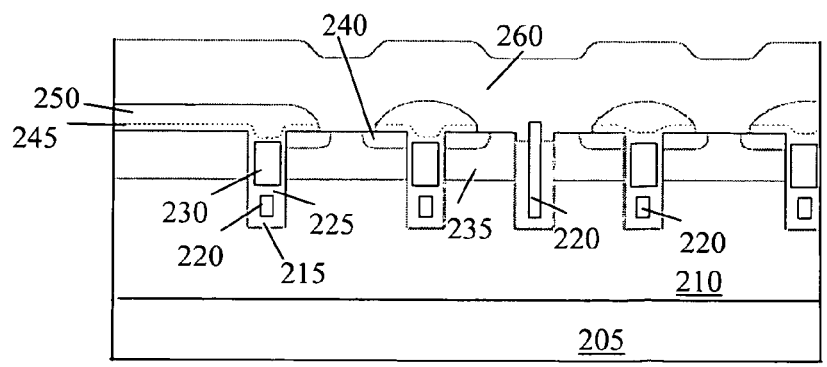

In FIG. 3L, a contact mask (not shown) is applied to open contact openings through the BPSG layer 250 and the LTO layer 245 followed by depositing a metal layer 260 after the contact mask (not shown) is removed. The source polysilicon 220 as that shown in FIG. 2C, is simply configured to directly contact through the continuous bottom-shielding electrode 130 as that provided in the macro-cell configuration that includes active cells and source connecting trench area shown in FIGS. 2A and 2C. With the macro-cell configuration, the bottom-shielding electrode 220 is connected to the source metal 260 through the interconnected trenched source connecting electrode 220 as shown. The wafer is then followed the rest of standard trench MOSFET steps to complete the processing.

Figure 3M:
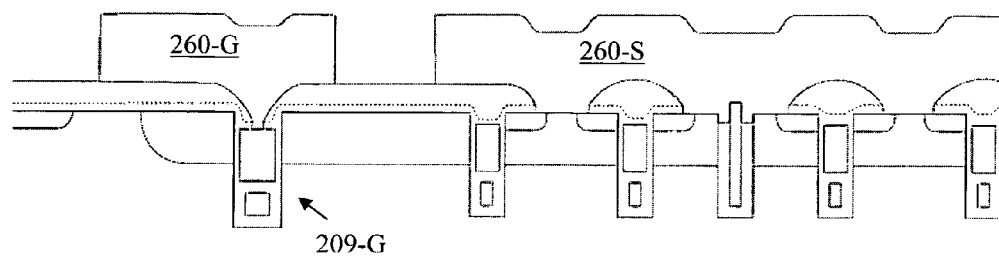
FIGS. 3M to 3O are a serial cross sectional views for describing another manufacturing process to provide a trenched MOSFET device as shown in FIG. 2.
Figure 3N:
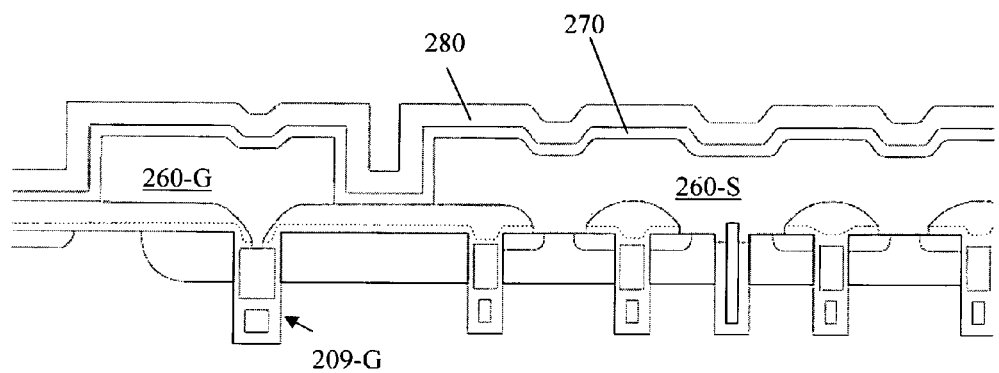
Figure 3O:
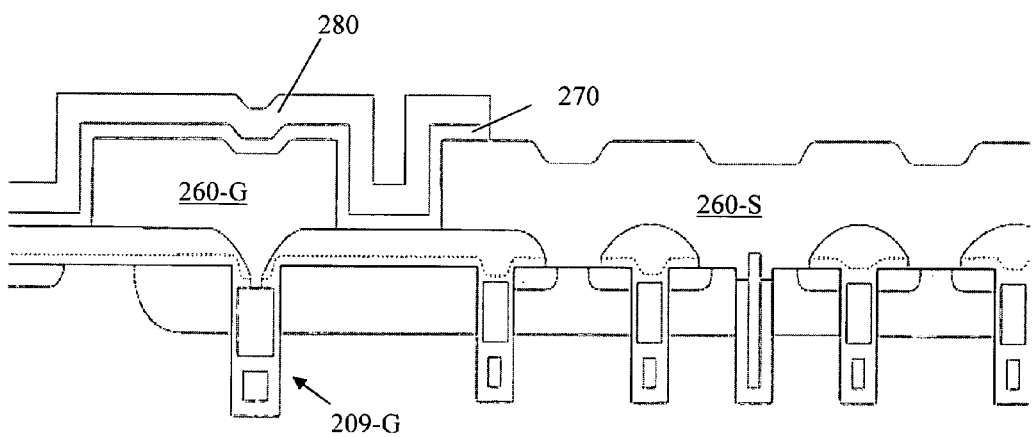

In another preferred embodiment as shown in FIGS. 3M-3O, the MOSFET has a gate runner trench for connecting the trenched gate to the gate pad for outside connection. The gate runner trench 209-G as shown in FIG. 3M may have the same SGT structure and be formed during the same process as the other SGT trenches, except that, the gate runner trench 209-G may be wider and deeper than other SGT trenches. Gate runner 209-G may also be located in the termination area. Following the process described in FIGS. 3A-3L, in FIG. 3M, a metal mask (not shown) is applied to pattern the metal layer into gate metal 260-G and source metal 260-S. In FIG. 3N, a plasma enhanced oxide and nitride deposition is carried out to form the oxide layer 270 and the nitride layer 280 as passivation layers. Then in FIG. 3O, a passivation mask (not shown) is applied to etch the passivation layer to cover the gate metal to protect the gate metal 260-G and to prevent a short circuit between the gate metal 260-G and the source metal 260-S. The wafer is also thinned and back metal is deposited to form the drain electrode.

According to above drawings and descriptions, this invention further discloses a power MOSFET device with a macro cell layout wherein each macro cell includes a plurality of polygon-shaped active cells wherein each cell comprising a source region separated by a plurality of interconnected trenches with a bottom-shielding electrode insulated from and disposed below a trenched gate wherein the bottom-shielding electrode being electrically connected to at least a trenched source connecting electrode formed within a section of the trenches dedicated as a source connecting trench for connecting the bottom-shielding electrode to a source metal. In a preferred embodiment, the source connecting trench extruding above the trenches for establishing a secure and reliable electrical connection with the source metal. In another preferred embodiment, the power MOSFET further includes an insulation protective layer disposed on top of the power MOSFET device having a plurality of source openings on top of the source region and the source-connecting trench provided for electrically connecting to the source metal. In another preferred embodiment, the power MOSFET device further includes an insulation protective layer disposed on top of the power MOSFET device MOSFET a gate opening provided for electrically connecting a gate pad to the trenched gate. In another preferred embodiment, the gate opening is disposed directly above a gate runner trench in a termination area of the power MOSFET device. In another preferred embodiment, the gate runner trench is wider and deeper than the trench provided for forming the trenched gate therein. In another preferred embodiment, the gate runner trench further includes a SGT structure with the bottom-shielding electrode. In another preferred embodiment, the power MOSFET device further includes a deep body-dopant region in a termination area to function as a guard ring or Junction-termination extension type termination. In another preferred embodiment, the deep body-dopant region is deeper than and encompassing a gate runner trench in the termination area.

Figure 4:
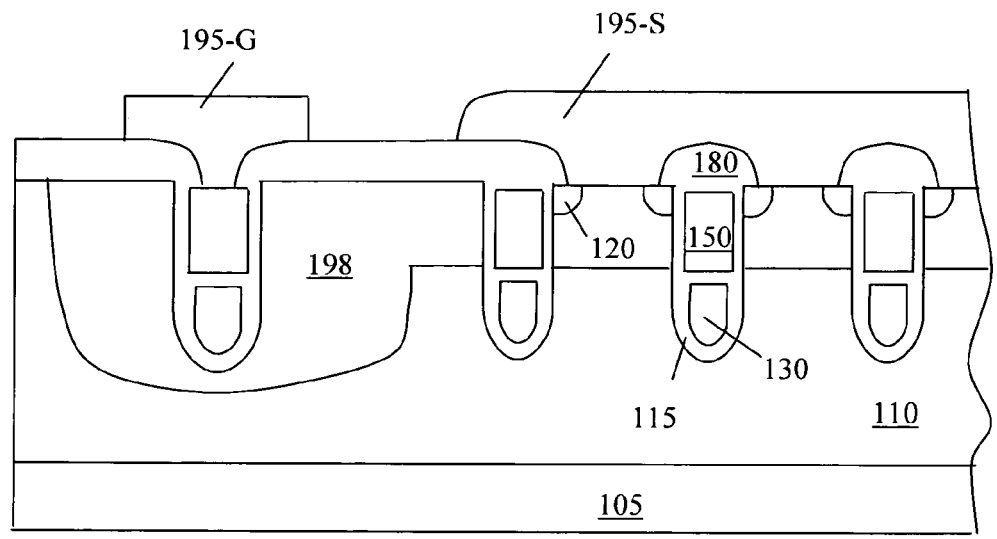
FIG. 4 is a side cross sectional view of another embodiment of this invention with specially configured termination area of a MOSFET device

FIG. 4 shows a MOSFET device with specially configured termination area for operation as a device for higher voltage rating. For a high voltage operation, the formation of the termination area usually requires a well-controlled placement of trenches filled with the source polysilicon and a thick oxide. FIG. 4 shows an alternate embodiment to this method. A deep p-region 198 is implanted and diffused at the outset of the process to form a guard ring or Junction-termination extension type termination. The guard ring or junction-termination extension formed with the p-region 198 surrounds the gate 150 in electrical contact with the gate metal 195-G.

Figure 5:
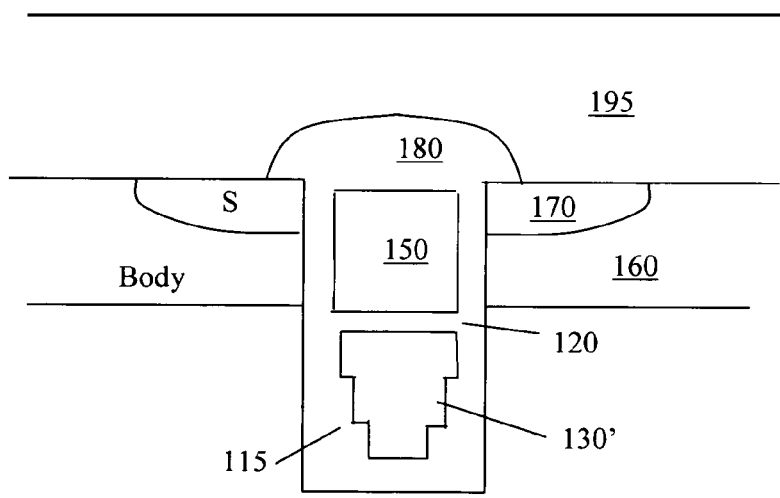
FIG. 5 shows another embodiment of this invention of a MOSFET device with specially configured SGT trenched gate to further reduce the gate to drain capacitance.

FIG. 5 shows an alternate trenched gate configuration formed with a more complex process with a tapered oxide structure in the bottom-shielding electrode 130' of the shield gate trench (SGT) disposed below the trenched gate 150. The first oxidation is carried out to the greatest desired thickness. After the polysilicon deposition and poly etch to a desired depth, a wet etch is performed to etch the oxide to a thinner oxide layer thickness along the trench sidewalls. A second polysilicon deposition and etch back is performed to a desired depth. The above processes are applied several times to provide a tapered polysilicon SGT structure 130' as shown in FIG. 5. At the penultimate polysilicon etch step, a mask is applied to leave the polysilicon flush with the top surface in the center of the source contact. Thereafter, the process is the same as the one shown above. Another approach to form such a graded oxide on the trench sidewall is to create a grading in implanted damage from a neutral species such as oxygen. Performing multiple implants into the sidewall at different angles provides the grading in implanted damage. The vertical implant has the highest dose for maximum damage. As the angle is increased, the dose is reduced to reduce the damage. Next, a single wet oxidation produces a tapered oxide profile along the sidewall. The advantage of the tapered oxide thickness is to allow the use of a flatter epitaxial doping profile. The doping profile is easier to control to achieve the same Rds performance.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, other conductive material instead of polysilicon may be used to fill the trenches. Accordingly, it is intended that the appended claims be interpreted as covering all alterations and modifications as fall within the true spirit and scope of the invention.

We claim:

1. A semiconductor power device comprising a plurality of power transistor cells surrounded by a trench opened in an active area on a semiconductor substrate wherein:
    at least one of said cells constituting an active cell having a source region disposed next to a trenched gate electrically connecting to a gate pad and surrounding said cell wherein said trenched gate further having a bottom-shielding electrode filled with a gate material disposed below and insulated from said trenched gate; and
    said bottom-shielding electrode filled with said gate material having a stepwise tapered profile having a stepwise reduced width and a substantially equal step height toward a bottom of said trench with a lining layer surrounded said gate material having a correspondingly stepwise increased thickness.

2. The semiconductor power device of claim 1 wherein:
    at least one of said cells constituting a source contacting cell surrounded by said trench with a portion functioning as a source connecting trench filled with said gate material for electrically connecting between said bottom-shielding electrode and a source metal disposed directly on top of said source contact trench.

3. The trenched power semiconductor power device of claim 2 further comprising:
    an insulation protective layer disposed on top of said semiconductor power device having a plurality of source openings opened through the insulation protective layer on top of said source region and said source connecting trench provided for electrically connecting the source region and the source connecting trench to said source metal disposed on top of the insulation protective layer.

4. The semiconductor power device of claim 2 further comprising:
    an insulation protective layer disposed on top of said semiconductor power device having a gate opening opened through the insulation protective layer provided for electrically connecting the trenched gate to said gate pad disposed on top of the insulation protective layer.

5. The semiconductor power device of claim 4 wherein:
    said gate opening is opened through the insulation protective layer directly above a gate runner trench in a termination area of said semiconductor power device.

6. The semiconductor power device of claim 5 wherein said gate runner trench in the termination area is wider and deeper than said trench surrounding the transistor cells with said trenched gate disposed therein.

7. The semiconductor power device of claim 5 wherein:
    said gate runner trench further includes SGT structure with said bottom-shielding electrode.

8. The semiconductor power device of claim 1 further comprising:
    a deep body-dopant region in a termination area to function as a guard ring or Junction-termination extension type termination.

9. The semiconductor power device of claim 8 wherein:
    said deep body-dopant region is deeper than and encompassing said gate runner trench in said termination area.

10. The semiconductor power device of claim 1 further comprising:
    a drain electrode disposed on a bottom surface of said semiconductor substrate.

11. The semiconductor power device of claim 1 wherein:
    each of said cells further includes a body region disposed between said trench surrounding said cells.

12. The semiconductor power device of claim 1 wherein each of said cells further includes a body region disposed between said trench surrounding said cells wherein said body region in said active cell encompassing said source region disposed next to said trenched gate.

13. The semiconductor power device of claim 1 wherein:
    an oxide layer is disposed above said bottom-shielding electrode to shield and insulate said bottom-shielding electrode from said trenched gate.

14. The semiconductor power device of claim 1 wherein:
    an oxide layer is disposed above said bottom-shielding electrode to shield and insulate said bottom-shielding electrode from said trenched gate wherein said oxide layer above said bottom-shielding electrode is disposed in said trench with a predefined depth controlled by a timed etch process.

15. The semiconductor power device of claim 14 wherein:
    said semiconductor power device having a reduced gate to drain capacitance Cgd depending on a depth of said oxide layer above said bottom-shielding electrode.

16. The semiconductor power device of claim 1 wherein:
    said power transistor cells further comprising trenched metal oxide semiconductor field effect transistor (MOSFET) cells.

17. The semiconductor power device of claim 1 where:
    said bottom-shielding electrode having at least two stepwise reduced widths and substantially equal step height toward a bottom of said trench with a lining layer surrounded said gate material having at least two correspondingly gradually stepwise increased thicknesses.

18. A semiconductor power device comprising:
    a trenched gate having a bottom-shielding electrode filled with a gate material disposed below and insulated from a trenched gate wherein said bottom-shielding electrode filled with said gate material having a stepwise tapered profile having a stepwise reduced width and a substantially equal step height toward a bottom of said trench with a lining layer surrounded said gate material having a correspondingly gradually stepwise increased thickness.

19. The semiconductor power device of claim 18 where:
said bottom-shielding electrode having at least two stepwise reduced widths and substantially equal step height toward a bottom of said trench with a lining layer surrounded said gate material having at least two correspondingly gradually stepwise increased thicknesses.

* * * * *